(12) United States Patent
Xie et al.

(10) Patent No.: US 8,187,717 B1
(45) Date of Patent: May 29, 2012

(54) HIGH PURITY CERAMIC ABRADABLE COATINGS

(75) Inventors: Liangde Xie, Pearl River, NY (US); Mitchell Dorfman, Smithtown, NY (US); Richard Schmid, Gerlikon (CH); Jacobus C. Doesburg, Edmonton (CA); Matthew Gold, Farmingdale, NY (US)

(73) Assignee: Sulzer Metco (US) Inc., Westbury, NY (US)

( * ) Notice: Subject to any disclaimer, the term of this patent is extended or adjusted under 35 U.S.C. 154(b) by 0 days.

(21) Appl. No.: 12/960,107

(22) Filed: Dec. 3, 2010

Related U.S. Application Data

(62) Division of application No. 11/520,041, filed on Sep. 13, 2006, now Pat. No. 7,955,707.

(60) Provisional application No. 60/724,268, filed on Oct. 7, 2005.

(51) Int. Cl.
   B32B 18/00 (2006.01)
   B05D 1/36 (2006.01)

(52) U.S. Cl. ........ 428/472; 428/469; 428/632; 428/633; 428/640; 428/701; 428/698; 428/323; 416/241 R; 416/241 B

(58) Field of Classification Search .................. None
See application file for complete search history.

(56) References Cited

U.S. PATENT DOCUMENTS

| | | | |
|---|---|---|---|
| 4,360,598 A | 11/1982 | Otagiri et al. | |
| 4,520,114 A | 5/1985 | David | |
| 4,535,033 A | 8/1985 | Stecura | |
| 4,565,792 A | 1/1986 | Knapp | |
| 4,639,356 A | 1/1987 | O'toole et al. | |
| 4,788,045 A | 11/1988 | Colombet et al. | |
| 4,849,142 A | 7/1989 | Panda et al. | |
| 4,898,368 A | 2/1990 | Shaffer et al. | |
| 4,936,745 A | 6/1990 | Vine et al. | |
| 5,015,502 A | 5/1991 | Strangman et al. | |
| 5,073,433 A | 12/1991 | Taylor | |
| 5,106,794 A | 4/1992 | Oizumi et al. | |
| 5,418,003 A | 5/1995 | Bruce et al. | |

(Continued)

FOREIGN PATENT DOCUMENTS

EP 1 126 044 8/2001

(Continued)

OTHER PUBLICATIONS

U.S. Appl. No. 11/790,430, filed Apr. 25, 2007.

(Continued)

*Primary Examiner* — Jennifer McNeil
*Assistant Examiner* — Vera Katz
(74) *Attorney, Agent, or Firm* — Greenblum & Bernstein, P.L.C.

(57) ABSTRACT

The invention is directed to a material and method for obtaining a ceramic abradable system for high temperature applications. High purity partially stabilized zirconia and/or hafnia base material has higher sintering resistance compared to conventional 6-9 weight percent yttria stabilized zirconia systems. The benefits of these systems are higher service lifetime and low thermal conductivity to achieve high operating temperatures. System includes a superalloy substrate, oxidation resistant bond coat and a thick ceramic abradable top coat. Total coating thickness is about 0.5-5 mm. In some applications an intermediate layer of high purity partially stabilized zirconia or a partially stabilized YSZ/MCrAlY cermet is applied over the oxidation resistant bond coat. In other applications an abradable system is applied on top of a grid. Additional benefits should be reduced blade wear at high operating conditions.

24 Claims, 4 Drawing Sheets

U.S. PATENT DOCUMENTS

| | | | |
|---|---|---|---|
| 5,705,231 | A | 1/1998 | Nissley et al. |
| 5,780,110 | A | 7/1998 | Schaeffer et al. |
| 5,780,171 | A | 7/1998 | Nissley et al. |
| 6,017,647 | A * | 1/2000 | Wallin .................... 429/482 |
| 6,042,878 | A | 3/2000 | Bruce et al. |
| 6,102,656 | A | 8/2000 | Nissley et al. |
| 6,123,997 | A | 9/2000 | Schaeffer et al. |
| 6,284,691 | B1 | 9/2001 | Bruce |
| 6,352,788 | B1 | 3/2002 | Bruce |
| 6,358,002 | B1 | 3/2002 | Good et al. |
| 6,457,939 | B2 * | 10/2002 | Ghasripoor et al. ....... 415/174.4 |
| 6,812,176 | B1 | 11/2004 | Zhu et al. |
| 6,869,550 | B2 | 3/2005 | Dorfman et al. |
| 6,893,994 | B2 | 5/2005 | Wallar |
| 6,960,395 | B2 | 11/2005 | Spitsberg et al. |
| 7,001,859 | B2 | 2/2006 | Zhu et al. |
| 7,186,466 | B2 | 3/2007 | Zhu et al. |
| 7,723,249 | B2 * | 5/2010 | Doesburg et al. ............. 501/103 |
| 7,776,459 | B2 | 8/2010 | Schlichting et al. |
| 7,846,561 | B2 | 12/2010 | Kulkarni |
| 2002/0094448 | A1 | 7/2002 | Rinney et al. |
| 2004/0005452 | A1 * | 1/2004 | Dorfman et al. ............. 428/323 |
| 2004/0033884 | A1 | 2/2004 | Wallar |
| 2004/0197580 | A1 * | 10/2004 | Dorfman et al. ............. 428/472 |
| 2004/0229031 | A1 | 11/2004 | Gell et al. |
| 2005/0170200 | A1 | 8/2005 | Nagaraj et al. |
| 2005/0238894 | A1 | 10/2005 | Gorman et al. |
| 2006/0193993 | A1 * | 8/2006 | Dorfman et al. ............. 427/446 |
| 2006/0216534 | A1 | 9/2006 | Boutwell et al. |
| 2007/0082131 | A1 | 4/2007 | Doesburg et al. |
| 2007/0274837 | A1 | 11/2007 | Taylor et al. |
| 2008/0160172 | A1 | 7/2008 | Taylor et al. |
| 2008/0220209 | A1 | 9/2008 | Taylor et al. |
| 2009/0315227 | A1 | 12/2009 | Ferrier et al. |
| 2010/0075147 | A1 | 3/2010 | Doesburg et al. |
| 2011/0003119 | A1 | 1/2011 | Doesburg et al. |

FOREIGN PATENT DOCUMENTS

| | | |
|---|---|---|
| EP | 1 889 949 | 2/2008 |
| JP | 011 797 25 | 7/1989 |
| JP | 2005-002409 | 6/2005 |
| WO | 2008/096072 | 8/2008 |
| WO | 2009/038785 | 3/2009 |

OTHER PUBLICATIONS

Goedjen et al. Proceedings of the $8^{th}$ National Thermal Spray Conference Sep. 11-15, 1995, Houston TX p. 73-77.

Miller et al. Proceedings of the $7^{th}$ National Spray Conference, Jun. 20-24, 1994, Boston MS p. 49-54.

"Amperit Thermal Spray Powder Catalog," H.C. Starck GmbH, published 2005.

Online Catalog "Product Information Amperit 832 Catalog," H.C. Starck GmbH, found at http://www.hcstarck.com/medien/dokumente/document_Produktinfo832.pdf.

"Amperit Thermal Spray Powder Catalog," H.C. Starck, published 1995.

Sherif et al. J. Am. Ceram. Soc., 74(2), 1991, 375-380.

R. Vaben, N. Czech, W. Mallener, W. Stamm, D. Stover, "Influence of impurity content and porosity of plasma-sprayed yttria-stabilized zirconia layers on the sintering behavior", pp. 135-140, Apr. 10, 2000, www.eisevier.nl/locate/surfcoat, Germany.

Robert A. Miler, "Thermal Barrier Coatings for Aircraft Engines—History and Directions", NASA Lewis Research Center Mar. 1995, pp. 17-27, Cleveland, OH.

Lou George, "PRAXAIR Introduces New Yttria-Stabilized Zirconia Power", p. 22, www.ptihome.com, Spraytime First Quarter 2003.

* cited by examiner

HIGH PURITY CERAMIC ABRADABLE COATINGS

CROSS REFERENCE TO RELATED APPLICATIONS

The present application is a Divisional of U.S. application Ser. No. 11/520,041 filed Sep. 13, 2006, now U.S. Pat. No. 7,955,707, which is expressly incorporated by reference in its entirety. This application also claims priority under 35 U.S.C. §119(e) from U.S. Provisional Patent Application No. 60/724,268, filed on Oct. 7, 2005, which is incorporated herein in its entirety by reference.

STATEMENT REGARDING FEDERALLY SPONSORED RESEARCH OR DEVELOPMENT

Not Applicable

REFERENCE TO A "MICROFICHE APPENDIX"

Not Applicable

BACKGROUND OF THE INVENTION

1. Field of the Invention

The present invention relates to the material, manufacture and article of abradable seals for use in gas turbine engines, and more particularly to high purity zirconia and/or hafnia based ceramic abradable seals that are thermal sprayed.

2. Description of the Related Art

Large gas turbine engines are widely used for aircraft propulsion and for ground based power generation. Such large gas turbine engines are typically of the axial type, and include a compressor section, a combustor section, and a turbine section, with the compressor section normally preceded by a fan section. Each of the fan, compressor, and turbine sections comprises a plurality of disks mounted on a shaft, with a plurality of airfoil shaped blades projecting radially therefrom. A hollow case surrounds the various engine sections. Located between the disks and projecting inward from the case assembly which surrounds the disks are a plurality of stationary vanes. During operation of the fan, compressor, and turbine sections, axially flowing gases alternately contact moving blades and the stationary vanes. In the fan and compressor sections, air is compressed and the compressed air is combined with fuel and burned in the combustion section to provide high pressure, high temperature gases that flow through the turbine section, where energy is extracted by causing the bladed turbine disks to rotate. A portion of this energy is used to operate the compressor section and the fan section.

Engine efficiency depends to a significant extent upon minimizing leakage by control of the gas flow in such a manner as to maximize interaction between the gas stream and the moving and stationary airfoils. A major source of inefficiency is leakage of gas around the tips of the compressor blades, between the blade tips and the engine case. Accordingly, means to improve efficiency by reduction of leakage are increasingly important. Although a close tolerance fit may be obtained by fabricating the mating parts to a very close tolerance range, this fabrication process is extremely costly and time consuming. Further, when the mated assembly is exposed to a high temperature environment and high stress, as when in use, the coefficients of expansion of the mating parts may differ, thus causing the clearance space to either increase or decrease. The latter condition would result in a frictional contact between blades and housing, causing elevation of temperatures and possible damage to one or both members. On the other hand, increased clearance space would permit gas to escape between the compressor blade and housing, thus decreasing efficiency.

One means to increase efficiency is to apply a coating of suitable material to the interior surface of the compressor and/or turbine housing, to reduce leakage between the blade tips and the housing. Various coating techniques have been employed to coat the inside diameter of the compressor and/or turbine housing with an abradable coating that can be worn away by the frictional contact of the blade, to provide a close fitting channel in which the blade tip may travel. Thus, when subjecting the coated assembly to a high temperature and stress environment, the blade and the case may expand or contract without resulting in significant gas leakage between the blade tip and the housing. This abradable coating technique has been employed to not only increase the efficiency of the compressor/turbine, but to also provide a relatively speedy and inexpensive method for restoring excessively worn turbine engine parts to service.

Increased firing temperatures is another approach to improved engine efficiency. However, even nickel and cobalt superalloys are not capable of surviving long term operation at the firing temperatures of modern gas turbine engines that may exceed 1,400° C. in oxidizing environments. In order to provide additional protection to the metal components in the hottest areas of a gas turbine engine, it is known to coat the metal substrate with a layer of ceramic material to thermally insulate and chemically isolate the substrate from the hot combustion gasses. A widely used material for this application is yttria stabilized zirconia (YSZ), with 6-9 weight percent yttria ($Y_2O_3$) being a common composition.

Technical benefits of 6-9 weight percent YSZ include a high thermal expansion coefficient compared to other ceramics such as alumina. Typically the expansion coefficient mismatch is more comparable to superalloy based materials and oxidation resistant bond coat alloys. Other technical benefits of 6-9 weight percent YSZ include excellent thermal insulation, the fact that it is chemically inert for most environments, thermally stability up to 1200° C. under isothermal or cyclic conditions, and general ease and cost effectiveness of application through thermal spray technology.

Besides material properties, microstructure plays an important role in engine performance. An important consideration in the design of a thermal barrier is that the coating be a ceramic material having a crystalline structure containing beneficial cracks and voids (porosity), imparting strain tolerance. If there were no cracks in the coating, the thermal barrier would not function, because the differences in thermal expansion between the metal substrate system and the coating will cause interfacial stresses upon thermal cycling that are greater than the bond strength between them. By the creation of a crack network into the coating, a stress relief mechanism is introduced that allows the coating to survive numerous thermal cycles. Repeating crack networks are typically imparted into the coating on varying space scales by manipulating the thermodynamic and kinetic conditions of the manufacturing method, and different structures known to perform the coating task have been optimized likewise. In addition to this, cracks are also formed during service, so the structure formed upon coating manufacture changes with time, depending on the starting material phases in the manufactured coating and thermal conditions during service. There remains a need in the art for a coating material, coating material manufacturing method and coating manufacturing method that address the changes in the coating microstructure during its service lifetime.

Besides microstructure characteristics of YSZ coatings, another design factor determining coating lifetime is the sintering rate of the coating. When the coating is cycled above half of its absolute melting temperature, the coating begins to sinter causing volume shrinkage. As the coating shrinks, the stress difference between the coating and substrate increases. At a certain amount of shrinkage (which varies depending on the type of structure and thermal conditions during service), the stress difference exceeds the bonding strength of the coating and it becomes detached. Decreasing the sintering rate of the thermal barrier increases the amount of time before the catastrophic shrinkage is experienced, so it can become a major design consideration. For high purity zirconia alloys, the onset of sintering commences at temperatures above 1000° C.

The thermal insulating properties of ceramic thermal barrier coatings (TCB) have been the subjects of many design improvements over the years. Known thermal barrier coating materials include the use of zirconia stabilized with both yttria and erbia ($Er_2O_3$) in designated amounts. Other thermal barrier coating materials include gadolinia and hafnia, preferably forming gadolinia-hafnia, and a zirconia-based material with a dysprosium oxide having the dual function of stabilizing the zirconia and reducing the thermal conductivity of the zirconia due to phonons.

Abradable thermal barrier coatings require a highly porous coating network of, typically, between 20-35 percent porosity, which cannot be achieved by conventional flame spray techniques. Porosity is needed in order for the turbine blades to cut grooves in the abradable coating. Previous testing of ceramic materials has shown that high porosity levels, in excess of about 35 volume percent, produce coatings prone to erosion damage. Porosity levels of less than about 20 volume percent are unsatisfactory because they cause excess blade tip wear. The material from which the coating is formed must abrade relatively easily without wearing down the blade tips. This requires a careful balance of materials in the coatings. In this environment, an abradable coating must also exhibit good resistance against particle erosion and other degradation at elevated temperatures. As known by those skilled in the art, however, these desirable characteristics have been difficult to obtain. The porosity levels achieved by conventional techniques for ceramic coatings using conventional powders normally range between 5 and 20 percent, and the porosity level, it has been found, is a direct function of the powder size and spraying parameters, e.g., spray rate, spray distance and power levels of the spray gun.

Past turbine sealing structures have taken a variety of forms. Some of the currently favored approaches include complex plasma sprayed structures that vary in composition from metal at one surface to ceramic at an outer surface with variations in composition, stress and porosity in between. These structures usually have a thickness on the order of 4 mm and are costly because of the need to carefully control the substrate temperature and plasma spray conditions, during the deposition of many layers, to achieve the correct abradable and durable structure. Such thick seal structures will spall and fail if the deposition parameters are not followed closely. Likewise in service these seals with their built-in varying stresses are subject to foreign object damage. When failure of thick seals does occur excess leakage results through the resulting wide gap.

With continuing efforts to improve gas turbine efficiency through use of better seals and use of higher temperatures, there remains a need in the art for coating materials and coating application methods that provides improved high-temperature properties and wear characteristics for abradable thermal barrier coatings.

SUMMARY

Accordingly, the invention is directed to a material and method for obtaining a ceramic abradable system for high temperature applications. High purity partially stabilized zirconia ($ZrO_2$) and/or hafnia ($HfO_2$) base material has a higher sintering resistance compared to conventional 6-9 weight percent yttria ($Y_2O_3$) stabilized zirconia systems. The benefits of these systems are higher service lifetime and low thermal conductivity to achieve high operating temperatures. System includes a superalloy substrate, oxidation resistant bond coat and a thick ceramic abradable top coat. Total coating thickness may be in the range of about 0.5-5.0 mm. In some applications an intermediate layer of high purity partially stabilized zirconia or a partially stabilized YSZ/MCrAlY cermet is applied over the oxidation resistant bond coat. In other applications an abradable system is applied on top of a grid. Additional benefits should be reduced blade wear at high operating conditions. The invention provides desired coating structures so that the changes in the coating microstructure over the in-service lifetime are either limited or beneficial. Typical porosity levels may be between about 10-60 volume percent and are achieved using a fugitive material of polymer, carbon or hollow ceramic particles. The coating may be applied using thermal spray methods.

BRIEF DESCRIPTION OF THE DRAWINGS

The accompanying drawings are included to provide further understanding of the invention and are incorporated in and constitute a part of this specification. The accompanying drawings illustrate embodiments of the invention and together with the description serve to explain the principles of the invention. In the figures.

DETAILED DESCRIPTION OF THE INVENTION

Reference will now be made in detail to the preferred embodiments of the present invention, examples of which are illustrated in the accompanying drawings.

Embodiments of the present invention are used to increase the operation life and temperature of ceramic seal systems using high purity zirconia based ceramics. Modern large gas turbine engines employ axial compressors and turbines. An axial flow stage comprises a plurality of airfoils mounted radially at the periphery of a disk that is secured to a shaft. In the compressor section the airfoils act on the air to compress it whereas in the turbine section the products of combustion act on the turbine blade to cause rotation. Axial flow stages are surrounded by a case structure which serves in part to eliminate the leakage of flow around the free ends of the blades. Such leakage is wasteful and reduces efficiency. Modern gas turbine engine designers have gone to great lengths to devise useful sealing structures that generally comprise an abradable coating on the case surface, usually in combination with a blade tip treatment which renders the blade tips hard and resistant to wear. As shown, for example, in FIG. 1, when in use, the blade tips cut a path into the abradable coating and provide sealing.

Figure 1:
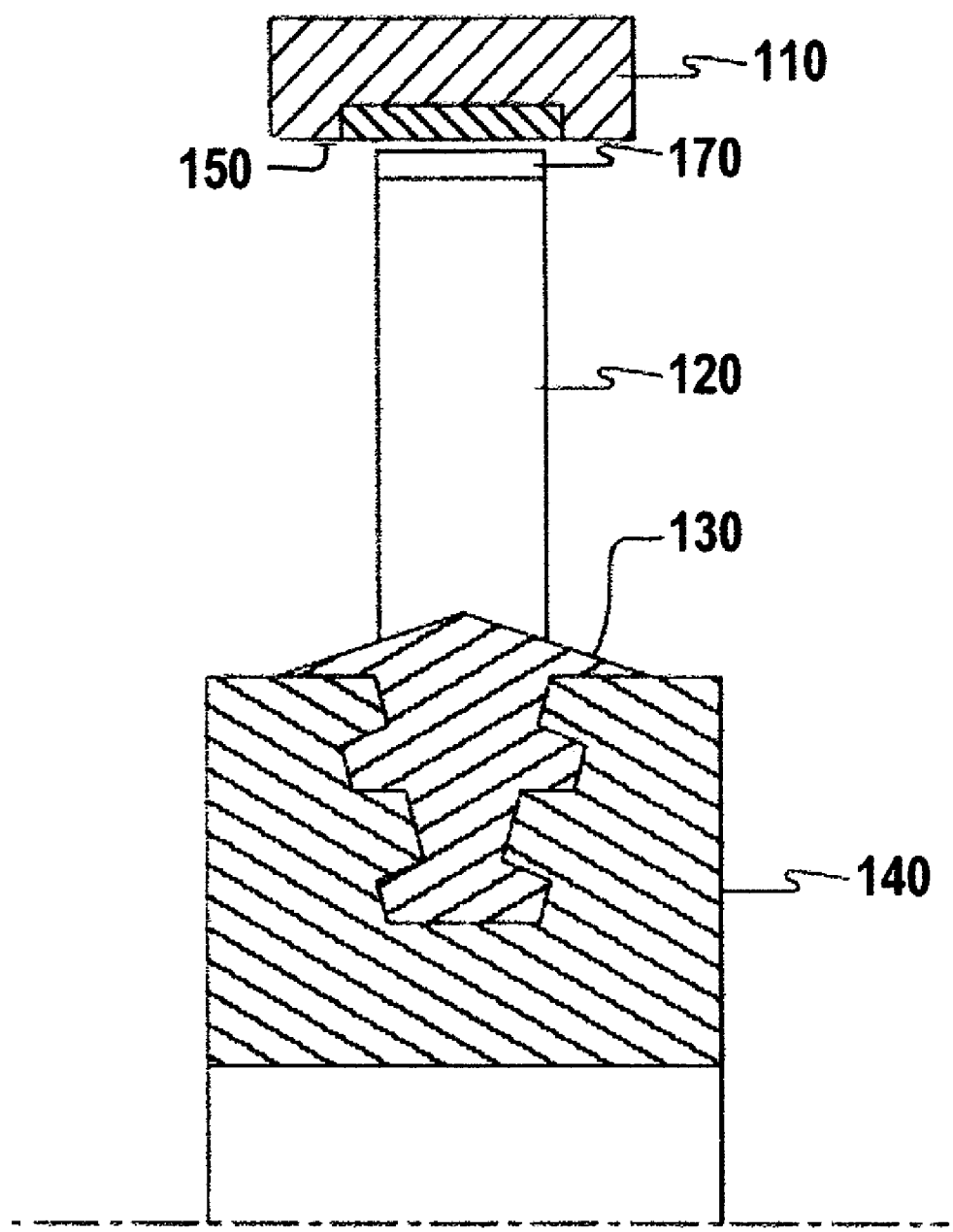
FIG. 1 illustrates a typical ceramic abradable system.

In embodiments of the present invention the casing surface of the blade is coated with a thermal barrier coating made of ultra-pure zirconia ($ZrO_2$) and/or hafnia ($HfO_2$). The ceramic abradable coating may be applied directly to the surface or on an MCrAlY bonding layer applied between the surface and the coating or applied to a graded or discrete layered cermet coating which is above the MCrAlY bond coat. FIG. 1 shows a cross-sectional view of a typical ceramic abradable coating system in a gas turbine engine. FIG. 1 shows a blade 120 that is affixed to a blade root 130 and disc 140. The disc 140 is driven so as to impart rotational movement to the blade 120. The blade 120 also has an abrasive tip 170 that may be made of an abrasive material, such as cubic boron nitride (cBN) embedded in a creep resistant alloy matrix. FIG. 1 also shows the casing segment 110 or shroud which acts to cover or house the entire gas turbine engine. An abradable seal coating 150 is provided between the abrasive tip 170 of the blade 120 and the casing segment 110. The coating 150 may be applied to the surface of the casing 110 through a variety of methods known in the art including thermal spray techniques such as powder flame spray, electro-photeric deposition (EPD), or preferably plasma spray. The material may be supplied as a powder, solution or suspension. Powder may be in the form of a spray dried powder of the individual constituents and organic binder, spray dried powder of the combined individual constituents and organic binder, fused and crushed powder, agglomerated and sintered powder, plasma densified material or powder from chemical solution routes. Typical particle sizes may vary, but are typically in the range of about 5-150 microns when deposited by various thermal spray equipments, preferably 15-125 microns for air plasma spray and about 30 microns or less for low pressure plasma spray.

When applied, the coating forms a crack network and voids (porosity) that allow it to survive the stress of numerous thermal cycles. Cracks are also formed and destroyed during service, mainly during thermal cycling; so the structure formed upon coating manufacture changes with time, depending on the starting material phases. Decreasing the sintering rate increases the amount of time before a critical fraction of cracks and pores are destroyed and eventual coating failure will occur.

One reason for using the zirconia ($ZrO_2$)-based and/or hafnia ($HfO_2$)-based systems is that they have both a high thermal expansion relative to other ceramics that is close to the thermal expansion of the MCrAlY bond coat and the metal substrate system it protects. Also these material systems have a low thermal conductivity to give the highest level of thermal protection. Other ceramic systems do not possess both of these functions. Zirconia is currently the preferred system, primarily because of its comparatively lower cost. Hafnia offers equivalent or superior property advantages over zirconia, but has typically not been used in commercial applications due to its cost. Nonetheless, hafnia is almost always present in zirconia due to the difficulty of their separation during mineral processing. While further discussion for convenience will address the zirconia-based system, the discussion below is also applicable to hafnia-based systems.

Figure 2:
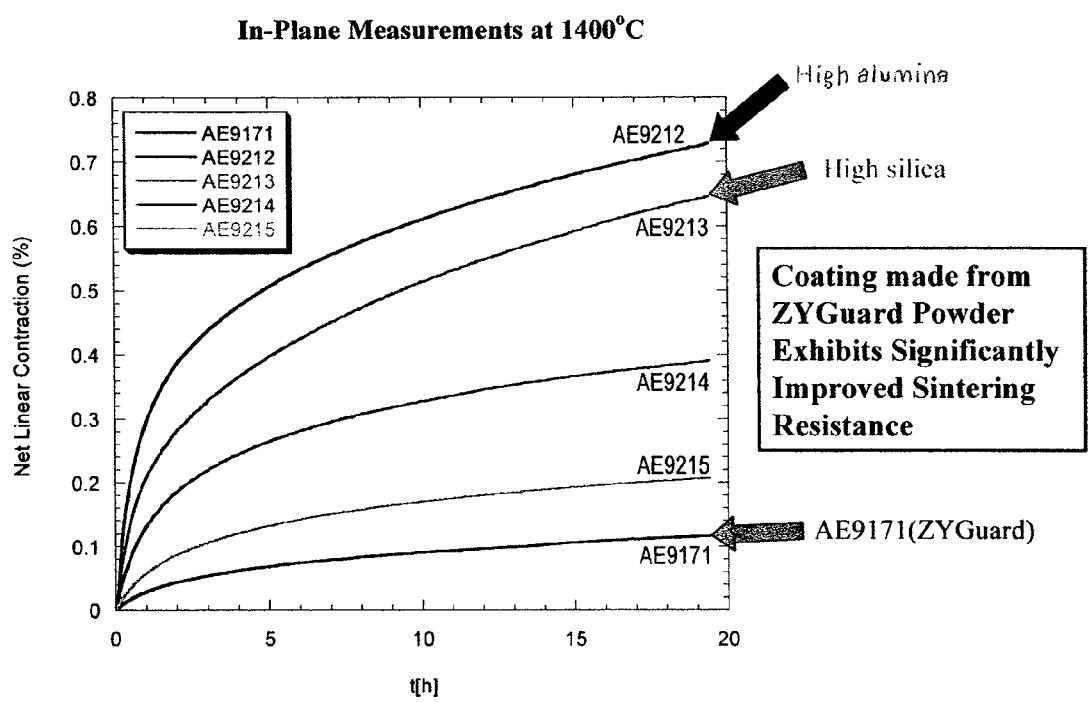
FIG. 2 provides a graph of in-plane sintering resistance of ceramic when subjected to a superalloy blade at 1400° C.

To achieve optimal performance, the material purity of the starting materials (zirconia and/or hafnia) must be as high as possible within economic reason. For the present invention the zirconia and/or hafnia has impurities less than or equal to 0.15 weight percent, preferably less than 0.10 weight percent. The reason for this is that impurities such as silica and alumina and soda have a lower melting temperature than zirconia and/or hafnia and cause an increase in the sintering rate of the coating structure. The increased sintering rate is undesirable because any increase in sintering rate decreases the lifetime of the coating. Sintering decreases the surface area of the crack network within the coating, increasing the coating modulus over time until failure occurs. FIG. 2 shows the improvements in sintering resistance for high purity 6-9 weight percent YSZ ceramics as compared to standard, commercially available YSZ materials. FIG. 2 shows reduced in-plane shrinkage at 1400° C. for one embodiment of the inventive material (shown as ZYGuard in the figure).

The material of the present invention contains zirconia ($ZrO_2$) and/or hafnia ($HfO_2$) having a low amount of oxide impurities. For purposes of the present invention, oxide impurities can be defined as materials which when combined with each other or with zirconia/hafnia form phases with melting points much lower than that of pure zirconia/hafnia, especially, but not limited to soda ($Na_2O$), silica ($SiO_2$) and alumina ($Al_2O_3$). In accordance with embodiments of the invention, the maximum limits for known impurities in order to decrease sintering rate and therefore increase service lifetime are about:

$Na_2O$—0.1 weight percent
$SiO_2$—0.05 weight percent
$Al_2O_3$—0.01 weight percent
$TiO_2$—0.05 weight percent
$Fe_2O_3$—0.05 weight percent
CaO—0.05 weight percent
MgO—0.05 weight percent and preferably:
$Na_2O$—0.01 weight percent
$SiO_2$—0.01 weight percent
$Al_2O_3$—0.01 weight percent
$TiO_2$—0.01 weight percent
$Fe_2O_3$—0.01 weight percent
CaO—0.025 weight percent
MgO—0.025 weight percent.

In one particular embodiment, when used as a coating and stabilized with yttria ($Y_2O_3$), the maximum limits for known impurities are:

$Na_2O$—0.002 weight percent
$SiO_2$—0.005 weight percent
$Al_2O_3$—0.015 weight percent
$TiO_2$—0.002 weight percent
$Fe_2O_3$—0.04 weight percent
CaO—0.02 weight percent
MgO—0.002 weight percent
$Cr_2O_3$—0.001 weight percent.

Pure zirconia exists in three crystal phases at different temperatures. At very high temperatures (>2370° C.) the material has a cubic structure. At intermediate temperatures (1200 to 2372° C.) it has a tetragonal structure. At low temperatures (below 1200° C.) the material transforms to the monoclinic structure. The transformation from tetragonal to monoclinic is rapid and is accompanied by a 3 to 5 percent volume increase that causes extensive stress in the material. Thus, pure zirconia cannot fulfill the coating requirements for high-temperature cycling. The resulting massive stress difference between the coating and substrate caused by the phase transformation is greater than the bond strength between them, so the coating will detach.

Figure 3:
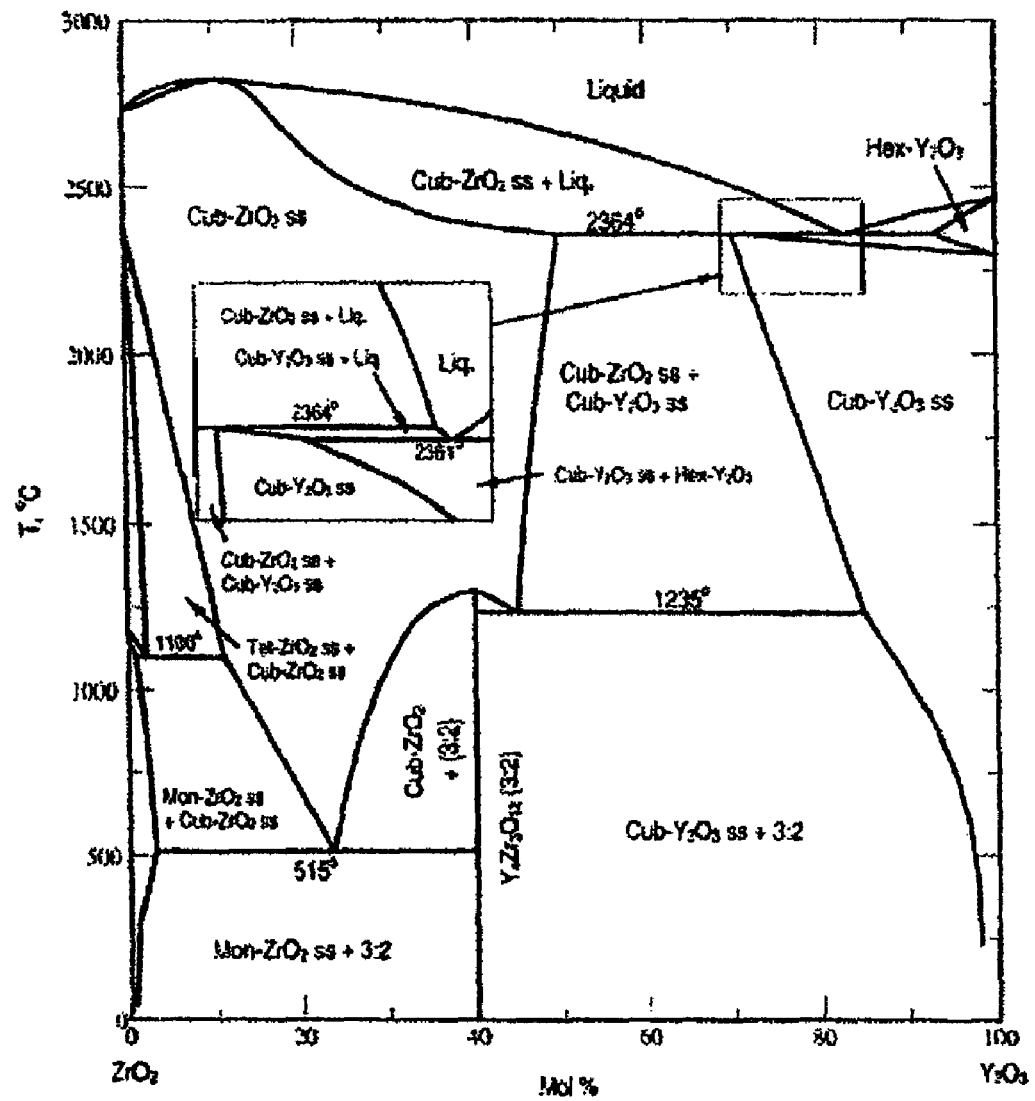
FIG. 3 provides a phase diagram for zirconia ($ZrO_2$) with stabilizer.

FIG. 3 provides a standard phase diagram for stabilized zirconia showing the general alloying trends for the zirconia stabilizers. (The diagram can be found, for example, in Ceramic Phase Diagram, vol. Zirconia, figure Zr-157.) Zirconia can be either partially or fully stabilized. Fully stabilized zirconia has an ionic structure that is cubic at all temperatures up to melting. Partially stabilized zirconia has an ionic structure that is tetragonal and has a phase transformation between tetragonal at higher temperatures and monoclinic plus cubic at lower temperatures. The temperature at which phase transformation occurs depends on the stabilizer material, as each stabilizer causes a different amount of suppression of the tetragonal to monoclinic phase transformation. At the suppressed temperatures, the rate of the phase transformation is greatly reduced. Over a large number of temperature cycles the phase transformation will slowly occur, gradually increasing the amount of monoclinic phase present and setting up the massive stress conditions that determine coating lifetime.

The phase transformation in partially stabilized zirconia causes localized stresses that lead to the formation of micron-sized micro-cracks in the coating that cancel out some of the massive stress caused by coating volume shrinkage. Thus, these two phenomena of the coating structure—shrinking and cracking—work against each other and finding a balance between them will maximize coating lifetime. This mechanism implies then that the structure of the crack network of the coating is changing with time as the phase of the ceramic material changes. This mechanism is required for a high temperature abradable coating to survive thermal cycling.

Rising fuel cost and other factors continue to drive the need for improved operational efficiency, and thus higher operating temperatures, of gas turbines. While yttria stabilized zirconia has been the material choice in the past—due in part to the fact that yttria is typically almost two orders of magnitude less expensive than ytterbia ($Yb_2O_5$)—greater operational temperatures can be achieved using ytterbia. Zirconia partially stabilized by ytterbia provides a better composition. As the need for higher operating temperatures increases, a higher coating material cost will be tolerated, so ytterbia partially stabilized zirconia may become a preferred thermal barrier coating system. Given the trade-offs of cost and performance, a combination of both yttria and ytterbia stabilizers will have optimum performance to cost ratio. In addition to ytterbia stabilized zirconia, ceramics dysprosium oxide stabilized zirconia ceramics have also shown potential benefits over standard YSZ ceramics for some thermal barrier/abradable seal applications.

Thus, in embodiments of the present invention, the stabilizer can be one or any combination of the following oxides: yttria ($Y_2O_3$), ytterbia ($Yb_2O_5$), scandia ($Sc_2O_3$), lanthanide oxide and actinide oxide. For purposes of the present invention, these oxides (namely, any oxide from group IIIB (column 3) of the periodic table of elements) can be referred to as rare earth oxides. The concentration range of stabilizers may vary generally between about 4-20 weight percent, depending upon the ratio of zirconia and hafnia in the material. Some suitable concentration ranges of stabilizers are about:

$Y_2O_3$—4-12 weight percent
$Yb_2O_5$—4-16 weight percent
$Y_2O_3$ and $Yb_2O_5$ and $Sc_2O_3$ or lanthanide oxide—4-16 weight percent; and preferably about:
$Y_2O_3$—6-9 weight percent
$Yb_2O_5$—10-16 weight percent
$Y_2O_3$ and $Yb_2O_5$—4-16 weight percent.

Dysprosia ($Dy_2O_3$) may replace ytterbia as one of the stabilizing oxides. Thus, in accordance with embodiments of the invention, the stabilizer can be one or any combination of the following oxides: yttria ($Y_2O_3$), ytterbia ($Yb_2O_5$) scandia ($Sc_2O_3$), lanthanide oxide and actinide oxide. As with the previous-discussed stabilizer grouping, the concentration range of these stabilizers may vary depending upon the ratio of zirconia and hafnia in the material. Suitable concentration ranges of stabilizers are about:

$Y_2O_3$—4-12 weight percent
$Dy_2O_3$—4-16 weight percent
$Y_2O_3$ and $Dy_2O_3$—4-16 weight percent
$Y_2O_3$ and $Dy_2O_3$ and $Sc_2O_3$ or lanthanide oxide-4-16 weight percent and preferably about:
$Y_2O_3$—6-9 weight percent
$Dy_2O_3$—6-14 weight percent
$Y_2O_3$ and $Dy_2O_3$—4-16 weight percent Other specific concentration ranges of stabilizers are provided in co-pending and commonly assigned U.S. patent application Ser. No. 11/520,043, entitled "CERAMIC MATERIAL FOR HIGH TEMPERATURE SERVICE," and U.S. patent application Ser. No. 11/520,044, entitled "OPTIMIZED HIGH TEMPERATURE THERMAL BARRIER," and U.S. patent application Ser. No. 11/520,042, entitled "OPTIMIZED HIGH PURITY COATING FOR A HIGH TEMPERATURE THERMAL CYCLING APPLICATIONS" each filed on Sep. 13, 2006 and each incorporated herein by reference.

By adding porosity to the coating a decrease in sintering rate can be achieved. Porosity can be introduced into the coating by adding to the material a different placeholder material (or fugitive phase) that can be removed later. If the coating is manufactured from a slurry, a foaming agent can be added in addition to agitation to introduce gas bubbles which become porosity upon drying of the coating.

Typically for thermal spray applications, a polymer or organic material in powder form can be added to the material blend. Powder may be in the form of a spray dried powder of the individual constituents and an organic binder, spray dried powder of the combined individual constituents and an organic binder, fused and crushed powder, agglomerated and sintered powder, plasma densified material or powder from chemical solution routes. The organic binder may be used to at least partially bond together the placeholder material and the ceramic material. For high temperature abradable coatings, the benefit of adding a fugitive phase is that a higher porosity than is achievable with conventional deposition methods. The increased porosity aids abradability by introducing more surfaces to the crack network of the coating, decreasing the coating elastic modulus and thus promoting controlled material removal. Thus, according to an embodiment of the invention, a coating material may have about 70 to 99 weight percent of a partially stabilized ultra-pure ceramic material as previously described and about 1-30 weight percent (and preferably 2-15 weight percent) of a placeholder material. The placeholder material may be an organic powder material or an inorganic powder material that can be burned out subsequent to deposition of the coating material.

Figure 4:
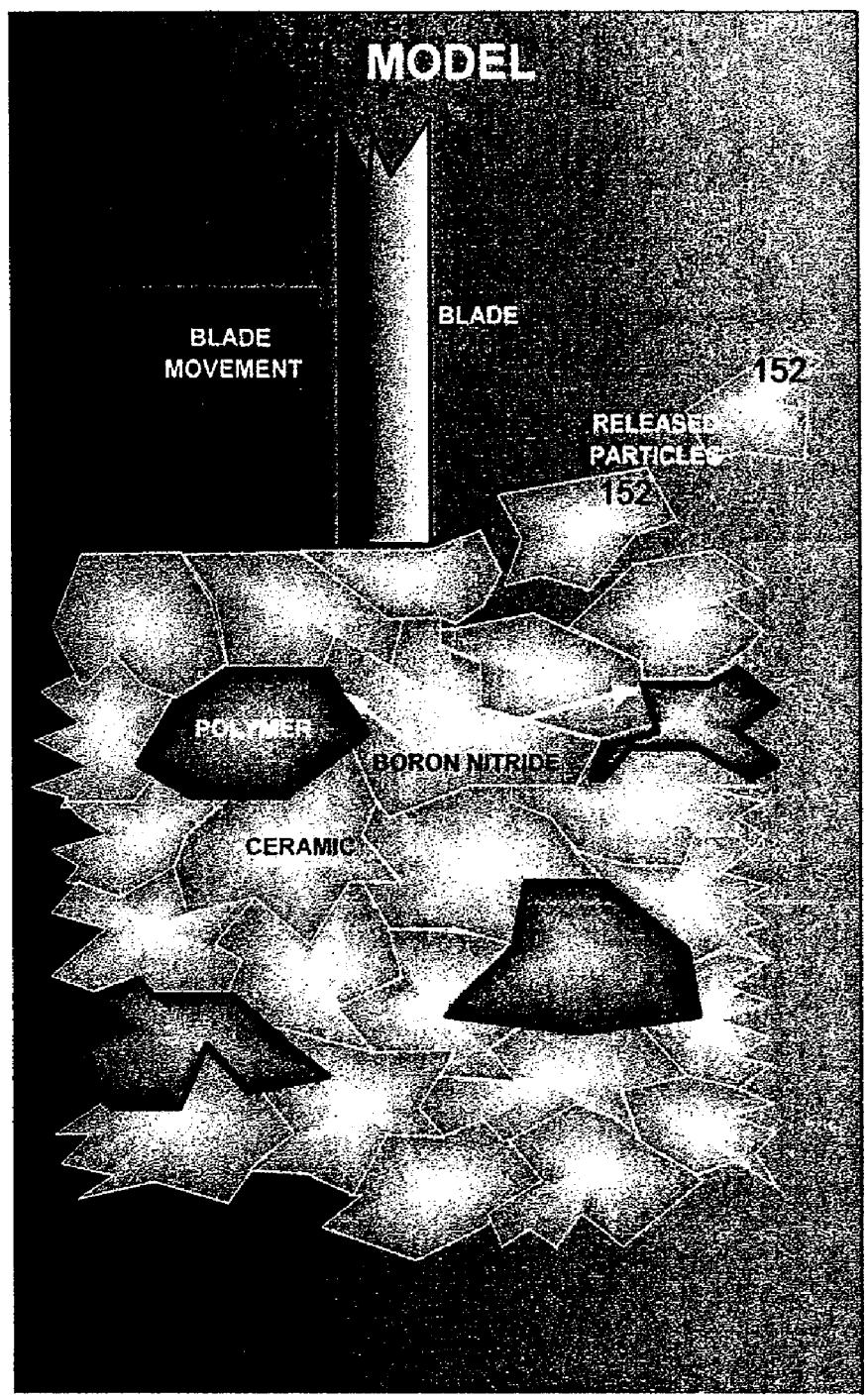
FIG. 4 provides a diagram showing a model for ceramic abradables.

In some typical thermal spray applications embodiments of the coating structure of the present invention may be formed by blending, agglomerating or cladding together the ceramic material and the placeholder material prior to said spraying. Other thermal spray applications may apply the ceramic material and the placeholder material in a co-spraying process. FIG. 4 is a typical model on how ceramic interacts and performs as an abradable when subjected to superalloy blade. As a blade 120 rotates, the blade 120 (which may have an abrasive tip, not shown) may contact an abradable seal coating 150 made from ceramic material is accordance with the present invention. The coating 150 is provided between the tip of the blade 120 and a casing segment (not shown). As the blade 120 contacts the coating 150, individual coating particles 152 may be broken off.

In accordance with embodiments of the invention, a high temperature abradable seal coating can be further optimized by building the coating in layers with different compositions, or by introducing a compositional gradient through the thickness of the coating. The reason for this is that due to the relatively low thermal conductivity of the coating, a temperature gradient exists in the coating during high temperature service. Thus there is a variation in the sintering rate through the thickness of the coating, and this means that the coating structure can be designed using the most optimal material at the surface, with less optimal materials towards the interface. Compositional gradients can be introduced into the coating during manufacture by using multiple feedstocks of different composition and varying their feed-rates during deposition. A few examples of discrete or graded layers could be: 1) MCrAlY bond coat, high purity YSZ intermediate coating and porous YSZ top coat; 2) MCrAlY bond coat, high purity dense YSZ intermediate layer and porous high purity ytterbia stabilized zirconia and 3) MCrAlY bond coat, low K TBC type material using two or more multiple stabilizers from ytterbia, ceria, gadolinium oxide, yttria, dysprosia that are alloyed with high purity zirconia or hafnia and a thick porous ceramic seal (reduced sintering resistance) of high purity ytterbia stabized zirconia.

A main property affecting the abradability of the coating is the elastic modulus. Since the elastic modulus increases with sintering, it is vital that a high temperature abradable coating has optimized sintering resistance. The thermal conductivity of the abradable coating does not need to be maximized because sometimes a higher thermal conductivity is required to remove frictional heating and avoid localized coating failure. A preferred coating structure for a high temperature abradable seal coating is lamellar with regular repeating porosity. For example, in some embodiments of the invention, properties of the high temperature abradable seal coating can be improved by spraying the ceramic material and the placeholder material onto a metal substrate using a thermal spray process at pressures between 1 Pa and 1 MPa, so as to form a stream of molten and/or semi-molten droplets that build up a coating of frozen lamellar splats subsequent to impact with the substrate. In a coating made from this application process, high temperature shrinkage or sintering occurs less in the in-plane direction of the droplets than in the through thickness direction. Typical porosity and micro cracks may be in the range of about 10 to 60 volume percent, preferably in the range of about 15 to 40 volume percent.

A high purity abradable seal top coat in accordance with embodiments of the present invention has improved sintering resistance compared to standard yttria stabilized zirconia based materials. Typical coating thicknesses for the abradable coating materials described herein are about 0.5 mm to 5 mm. In embodiments of the invention, the coating material may be applied over 1) an oxidation and/or hot corrosion resistant MCrAlY or MAl or MCr bond coat; 2) an intermediate, about 0.2 to 1.0 mm thickness, zirconia-stabilized ceramic or hafnia-stabilized ceramic that has a main function of reducing heat transfer to the substrate and improving adhesion; or 3) an intermediate cermet of an oxidation resistant MCrAlY and a high purity zirconia/hafnia ceramic that has a function of reducing heat transfer and minimizing thermal expansion differences between the ceramic abradable top coat and MCrAlY bond coat or substrate. The abradable seal base material may be a superalloy grid surface based on investment casting or some other manufacture techniques.

While exemplary embodiments of the invention have been shown and described herein, it will be obvious to those skilled in the art that such embodiments are provided by way of example only. Numerous insubstantial variations, changes, and substitutions will now be apparent to those skilled in the art without departing from the scope of the invention disclosed herein by the Applicants. Accordingly, it is intended that the invention be limited only by the spirit and scope of the claims, as they will be allowed.

The invention claimed is:

1. A high-purity abradable seal coating system comprising:
an abradable top coat formed of a composition comprising about 70-99 weight percent of a ceramic material and about 1-30 weight percent of a removable placeholder material, said ceramic material consisting essentially of about 4 to 20 weight percent of a stabilizer of one or more rare earth oxides, and a balance of at least one of zirconia ($ZrO_2$), hafnia ($HfO_2$) and combinations thereof, wherein the zirconia ($ZrO_2$) and/or hafnia ($HfO_2$) is partially stabilized by the stabilizer, and wherein the total amount of impurities is less than or equal to 0.15 weight percent;
said removable placeholder material comprising an organic powder material or an inorganic powder material, and said removable placeholder material being structured and arranged to be burned out subsequent to deposition of the coating material; and
one of an oxidation and/or hot corrosion resistant MCrAlY or MAl or MCr bond coat, an intermediate zirconia- or hafnia-stabilized ceramic, and an intermediate cermet of an oxidation-resistant MCrAlY and a high-purity zirconia/hafnia ceramic,
wherein the abradable top coat is sprayed over the bond coat, the zirconia- or hafnia-stabilized ceramic, or the intermediate cermet,
wherein the sprayed abradable top coat includes the ceramic material and the removable placeholder material and is sprayed using a thermal spray process at pressures between 1 Pa and 1 MPa, so as to form a stream of molten and/or semi-molten droplets that build up a coating of frozen lamellar splats subsequent to impact, and
wherein the removable placeholder material is removed from the sprayed abradable top coat to make a resulting sprayed abradable top coat having a structure including a ceramic matrix, porosity, and micro cracks.

2. The high-purity coating system of claim 1, wherein the stabilizer is about 4-16 weight percent, said stabilizer having at least one of yttria ($Y_2O_3$), ytterbia ($Yb_2O_5$), and combinations thereof.

3. The high-purity coating system of claim 1, wherein the stabilizer is about 4-16 weight percent, said stabilizer having at least one of yttria ($Y_2O_3$), dysprosia ($Dy_2O_3$), and combinations thereof.

4. The high-purity coating system of claim 1, wherein the abradable top coat has a thickness of about 0.5 mm to 5.0 mm.

5. The high-purity coating system of claim 1, further comprising an abradable seal base material made from a superalloy grid surface.

6. The high-purity coating system of claim 1, wherein the porosity and micro cracks are in the range of about 10 to 60 volume percent.

7. The high-purity coating system of claim 1, wherein the porosity and micro cracks are in the range of about 15 to 40 volume percent.

8. The high-purity coating system of claim 1, wherein the total amount of impurities is less than or equal to 0.10 weight percent.

9. The high-purity coating system of claim 1, wherein the amount of impurities is less than or equal to:
about 0.1 weight percent soda ($Na_2O$),
about 0.05 weight percent silica ($SiO_2$), about 0.01 weight percent alumina (Al$_2$O$_3$),
about 0.05 weight percent titania (TiO$_2$),
about 0.05 weight percent hematite (Fe$_2$O$_3$),
about 0.05 weight percent calcia (CaO), and
about 0.05 weight percent magnesia (MgO).

10. The high-purity coating system of claim 1, wherein the abradable top coat is lamellar with regularly repeating porosity.

11. A high-purity abradable seal coating system comprising:
an abradable top coat formed of a composition comprising about 70-99 weight percent of a ceramic material and about 1-30 weight percent of a removable placeholder material, said ceramic material consisting essentially of about 4 to 20 weight percent of a stabilizer of one or more rare earth oxides, and a balance of at least one of zirconia (ZrO$_2$), hafnia (HfO$_2$) and combinations thereof, wherein the zirconia (ZrO$_2$) and/or hafnia (HfO$_2$) is partially stabilized by the stabilizer, and wherein the total amount of impurities is less than or equal to 0.15 weight percent;
said removable placeholder material comprising an organic powder material or an inorganic powder material, and said removable placeholder material being structured and arranged to be burned out subsequent to deposition of the coating material; and
one of an oxidation and/or hot corrosion resistant MCrAlY or MAl or MCr bond coat, an intermediate zirconia- or hafnia-stabilized ceramic, and an intermediate cermet of an oxidation-resistant MCrAlY and a high-purity zirconia/hafnia ceramic,
wherein the abradable top coat is sprayed over the bond coat, the zirconia- or hafnia-stabilized ceramic, or the intermediate cermet,
wherein the sprayed abradable top coat includes the ceramic material and the removable placeholder material and is sprayed using a thermal spray process at pressures between 1 Pa and 1 MPa, so as to form a stream of molten and/or semi-molten droplets that build up a coating of frozen lamellar splats subsequent to impact, and
wherein the removable placeholder material is removed from the sprayed abradable top coat to make a resulting sprayed abradable top coat having a structure including a ceramic matrix, porosity, and micro cracks.

12. The high-purity coating system of claim 11, wherein the stabilizer is about 4-16 weight percent, said stabilizer having at least one of yttria (Y$_2$O$_3$), ytterbia (Yb$_2$O$_5$), and combinations thereof.

13. The high-purity coating system of claim 11, wherein the stabilizer is about 4-16 weight percent, said stabilizer having at least one of yttria (Y$_2$O$_3$), dysprosia (Dy$_2$O$_3$), and combinations thereof.

14. The high-purity coating system of claim 11, wherein the abradable top coat has a thickness of about 0.5 mm to 5.0 mm.

15. The high-purity coating system of claim 11, further comprising an abradable seal base material made from a superalloy grid surface.

16. The high-purity coating system of claim 11, wherein the porosity and micro cracks are in the range of about 10 to 60 volume percent.

17. The high-purity coating system of claim 11, wherein the porosity and micro cracks are in the range of about 15 to 40 volume percent.

18. The high-purity coating system of claim 11, wherein the total amount of impurities is less than or equal to 0.10 weight percent.

19. The high-purity coating system of claim 11, wherein the amount of impurities is less than or equal to:
about 0.1 weight percent soda (Na$_2$O),
about 0.05 weight percent silica (SiO$_2$),
about 0.01 weight percent alumina (Al$_2$O$_3$),
about 0.05 weight percent titania (TiO$_2$),
about 0.05 weight percent hematite (Fe$_2$O$_3$),
about 0.05 weight percent calcia (CaO), and
about 0.05 weight percent magnesia (MgO).

20. The high-purity coating system of claim 11, wherein the abradable top coat is lamellar with regularly repeating porosity.

21. A high-purity abradable seal coating system comprising:
an abradable top coat formed of a composition comprising about 70-99 weight percent of a ceramic material and about 1-30 weight percent of a removable placeholder material, said ceramic material consisting essentially of about 4 to 20 weight percent of a stabilizer of one or more rare earth oxides, and a balance of at least one of zirconia (ZrO$_2$), hafnia (HfO$_2$) and combinations thereof, wherein the zirconia (ZrO$_2$) and/or hafnia (HfO$_2$) is partially stabilized by the stabilizer, and wherein the total amount of impurities is less than or equal to 0.15 weight percent; and said removable placeholder material comprising an organic powder material or an inorganic powder material that can be burned out subsequent to deposition of the coating material; and
one of an oxidation and/or hot corrosion resistant MCrAlY or MAl or MCr bond coat, an intermediate zirconia- or hafnia-stabilized ceramic, and an intermediate cermet of an oxidation-resistant MCrAlY and a high-purity zirconia/hafnia ceramic,
wherein the abradable top coat is sprayed over the bond coat, the zirconia- or hafnia-stabilized ceramic, or the intermediate cermet,
wherein the sprayed abradable top coat includes the ceramic material and the removable placeholder material and is sprayed using a thermal spray process at pressures between 1 Pa and 1 MPa, so as to form a stream of molten and/or semi-molten droplets that build up a coating of frozen lamellar splats subsequent to impact, and
wherein the removable placeholder material is removed from the sprayed abradable top coat to make a resulting sprayed abradable top coat having a structure including a ceramic matrix, porosity, and micro cracks.

22. The high-purity coating system of claim 21, wherein the total amount of impurities is less than or equal to 0.10 weight percent.

23. The high-purity coating system of claim 21, wherein the amount of impurities is less than or equal to:
about 0.1 weight percent soda (Na$_2$O),
about 0.05 weight percent silica (SiO$_2$),
about 0.01 weight percent alumina (Al$_2$O$_3$),
about 0.05 weight percent titania (TiO$_2$),
about 0.05 weight percent hematite (Fe$_2$O$_3$),
about 0.05 weight percent calcia (CaO), and
about 0.05 weight percent magnesia (MgO).

24. The high-purity coating system of claim 21, wherein the abradable top coat is lamellar with regularly repeating porosity.

* * * * *